(12) United States Patent
Inoue et al.

(10) Patent No.: US 7,682,974 B2
(45) Date of Patent: Mar. 23, 2010

(54) METHOD FOR MANUFACTURING SEMICONDUCTOR DEVICE

(75) Inventors: Fumihiko Inoue, Aizuwakamatsu (JP); Junpei Yamamoto, Aizuwakamatsu (JP); Suguru Sassa, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 8 days.

(21) Appl. No.: 12/130,537

(22) Filed: May 30, 2008

(65) Prior Publication Data
US 2009/0004838 A1      Jan. 1, 2009

(30) Foreign Application Priority Data
Jun. 7, 2007      (JP) .............................. 2007-151620

(51) Int. Cl.
*H01L 21/302*      (2006.01)
*H01L 21/461*      (2006.01)

(52) U.S. Cl. ...................... 438/689; 438/691; 438/695; 257/E21.215; 257/E21.316

(58) Field of Classification Search ................. 438/689, 438/691, 695, 696; 257/E21.215, E21.316
See application file for complete search history.

(56) References Cited

U.S. PATENT DOCUMENTS

| 5,126,231 A * | 6/1992 | Levy ............................ 430/313 |
| 2007/0287283 A1 * | 12/2007 | Watanabe .................... 438/637 |
| 2008/0254627 A1 * | 10/2008 | Wells .......................... 438/689 |

* cited by examiner

*Primary Examiner*—Phuc T Dang

(57) ABSTRACT

A method for manufacturing a semiconductor device includes the steps of: forming an etching layer (17) formed of silicon on a semiconductor substrate (10); forming a mask layer (20) with a pattern on the etching layer (17), which includes an intermediate layer (22) as a silicon oxide film and a top layer (24) as a polysilicon; and etching the etching layer (17) using the mask layer (20) as a mask, and eliminating the top layer (24).

12 Claims, 8 Drawing Sheets

US 7,682,974 B2

METHOD FOR MANUFACTURING SEMICONDUCTOR DEVICE

CROSS-REFERENCE TO RELATED APPLICATIONS

The present invention is based on Japanese Patent Application No. 2007-151620 filed on Jun. 7, 2007, the disclosure of which is hereby incorporated by reference.

TECHNICAL FIELD

The invention relates to a method for manufacturing a semiconductor device, and more particularly, to a method for manufacturing a semiconductor device, which includes a step of etching an etching layer.

BACKGROUND OF THE INVENTION

The method for manufacturing a semiconductor device generally includes the step of etching an etching layer. For example, reduction of the interval between word lines serving as a gate electrode is important for miniaturizing a flash memory. Japanese PCT Patent Publication No. 2005-522029 discloses the process for forming the word line by etching the polysilicon layer as illustrated in FIGS. 5 to 10. More specifically, an intermediate layer and a top layer (serving as an antireflective film) are formed on the polysilicon, which are etched while using a photoresist as a mask (FIG. 6 in Japanese PCT Patent Publication No. 2005-522029). A side wall layer is formed on the side surfaces of the top and the intermediate layers, and the polysilicon layer is etched to form the word line (FIG. 8 in Japanese PCT Patent Publication No. 2005-522029). The side wall layer allows the interval between the thus formed word lines to be reduced. In the publication, an oxide film and a nitride film are employed as the intermediate layer and the top layer, respectively.

In the aforementioned method, the use of the nitride film as the top layer serving as the antireflective film increases the film thickness of the top layer. As the intermediate layer and the top layer are formed of different materials, the step of eliminating the top layer is required.

SUMMARY OF THE INVENTION

It is an object of the invention to provide a method for manufacturing a semiconductor device requiring no step of eliminating the top layer.

According to an aspect of the present invention, there is provided a method for manufacturing a semiconductor device including the steps of: forming an etching layer formed of silicon on a semiconductor substrate; forming a mask layer with a pattern on the etching layer, the mask layer including an intermediate layer formed of a silicon oxide film and a top layer formed of silicon; and etching the etching layer using the mask layer as a mask, and eliminating the top layer. The above-described method requires no step of etching the top layer because it is eliminated during the etching process applied to the etching layer. This makes it possible to reduce the manufacturing process step.

According to another aspect of the present invention, there is provided a method for manufacturing a semiconductor device including the steps of: forming an etching layer; forming a mask layer with a pattern on the etching layer, the mask layer including an intermediate layer and a top layer formed of the same element as that used for forming the etching layer; and etching the etching layer using the mask layer as a mask, and eliminating the top layer. In the method, the top layer is eliminated during the etching of the etching layer, thus eliminating an additional step of etching the top layer. This makes it possible to reduce the manufacturing process step.

DETAILED DESCRIPTION

The method for manufacturing the semiconductor device using the technique disclosed in Patent Document 1 will be described as a first comparative example referring to FIGS. 1A to 4C. The first comparative example relates to the method for manufacturing a flash memory with virtual ground type SONOS (Semiconductor Oxide Nitride Oxide Nitride) structure.

Figure 1A:
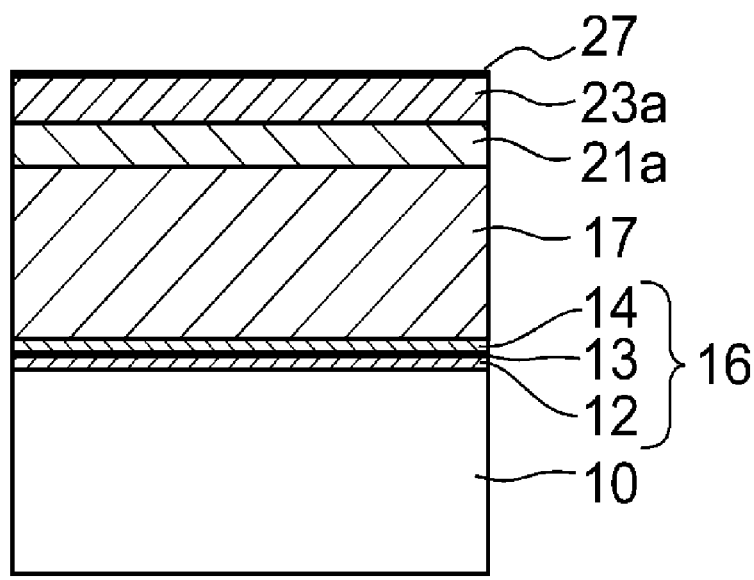
FIGS. 1A and 1B show sectional views illustrating the process for manufacturing a flash memory as a first related art (part 1)

Referring to FIG. 1A, an ONO film 16 is formed on a p-type silicon semiconductor substrate (or a p-type diffusion region in the semiconductor substrate) 10. The ONO film 16 is formed by sequentially layering a tunnel oxide film 12 formed as a silicon oxide film through the thermal oxidation method, a trap layer 13 formed as a silicon nitride film through a CVD (Chemical Vapor Deposition) method, and a top oxide film 14 formed as a silicon oxide film through the thermal oxidation method or the CVD method. An etching layer 17 formed of a polysilicon with its thickness of approximately 200 nm is applied onto the ONO film 16 through the CVD method. An intermediate layer 21a as a silicon oxide film with its thickness of 50 nm is further formed on the etching layer 17 through the CVD method. A top layer 23a as a silicon-rich silicon nitride film with its thickness of 50 nm is formed on the intermediate layer 21a through the CVD method. A silicon oxide film 27 with its thickness of approximately 1 nm is formed on the top layer 23a through ashing.

Figure 1B:
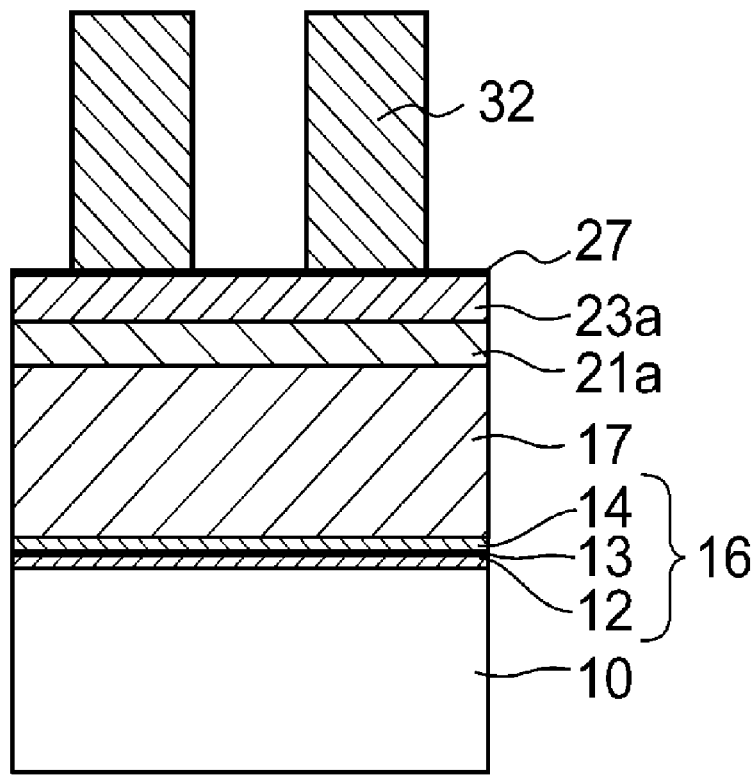

Referring to FIG. 1B, a photoresist film 32 with a thickness of approximately 300 nm is applied so as to form the patterns with each size of approximately 150 nm at intervals of approximately 140 nm through exposure development. The top layer 23a serves as an antireflective film for preventing the light reflection when the patterns are exposed, and the silicon oxide film 27 serves to prevent footing of the pattern.

Figure 2A:
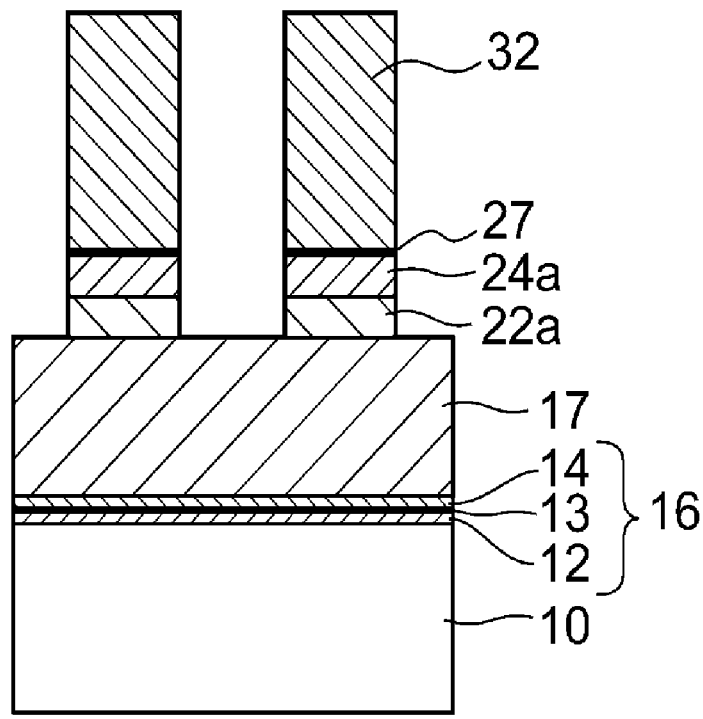
FIGS. 2A and 2B show sectional views illustrating the process for manufacturing the flash memory as the first related art (part 2)
Figure 2B:
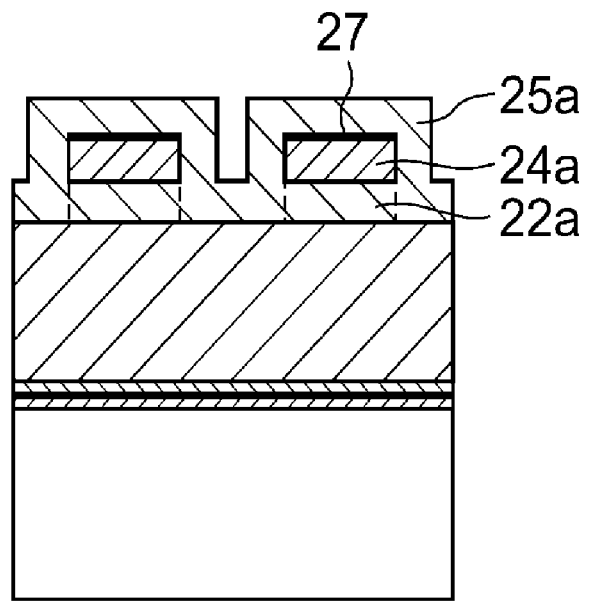

Referring to FIG. 2A, the silicon oxide film 27, the top layer 23a and the intermediate layer 21a are subjected to anisotropic dry etching to form a top layer 24a and an intermediate layer 22a having a pattern, while using the photoresist film 32 as a mask. The mixture gas which contains $CHF_3$/$Ar$/$O_2$ is used for etching the top layer 23a, and a mixture gas which contains $C_4F_8$/$CHF_3$/$Ar$/$O_2$ is used for etching the intermediate layer 21a. Referring to FIG. 2B, the photoresist film 32 is eliminated, and a cover layer 25a as the silicon oxide film with its thickness of approximately 50 nm is formed through the CVD method to cover the top layer 24a and the intermediate layer 22a.

Figure 3A:
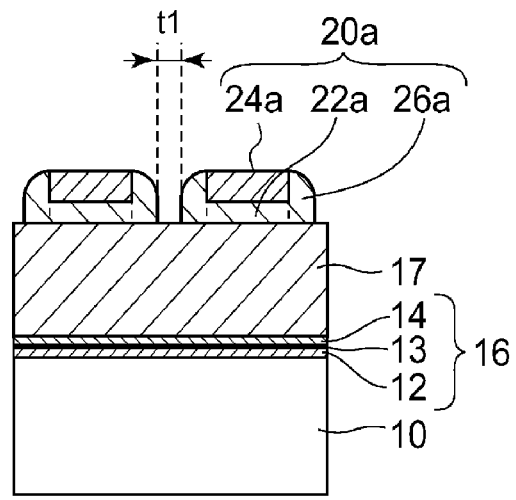
FIGS. 3A to 3C show sectional views illustrating the process for manufacturing the flash memory as the first related art (part 3)
Figure 3B:
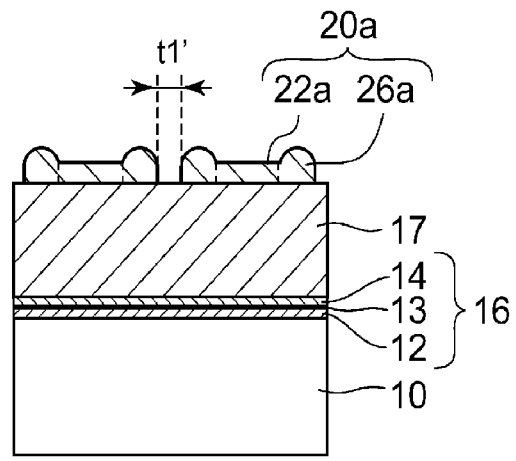
Figure 3C:
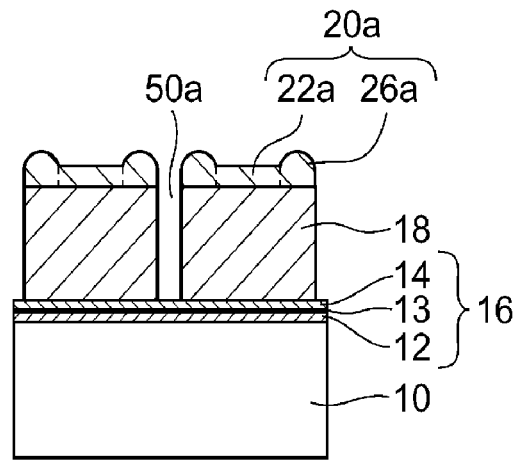

Referring to FIG. 3A, the entire surface of the above-formed layer is etched using the mixture gas of $C_4F_8$/$CHF_3$/$Ar$/$O_2$ to form side wall layers 26a at both side surfaces of the top layer 24a and the intermediate layer 22a, and to eliminate the cover layer 25a on the top layer 24a completely. Referring to FIG. 3B, the top layer 24a is etched using the mixture gas of $CHF_3$/$Ar$/$O_2$ so as to be eliminated, resulting in a mask layer 20a formed of the intermediate layer 22a and the side wall layers 26a. Referring to FIG. 3C, the etching layer 17 is etched using the gas of $HBr$/$Cl_2$/$O_2$ to form a word line 18 while allowing the mask layer 20a to serve as the mask.

Figure 4A:
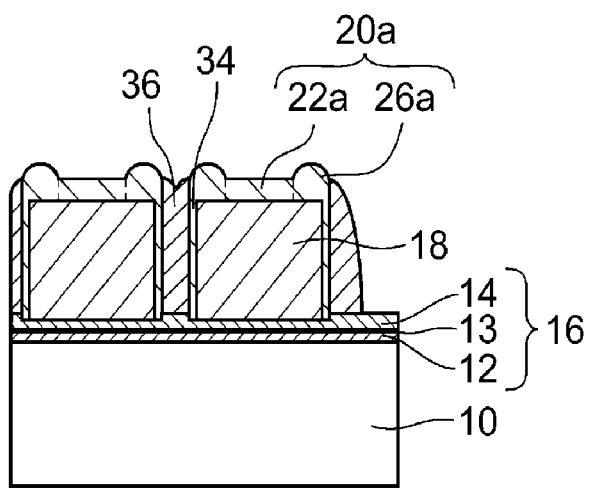
FIGS. 4A to 4C show sectional views illustrating the process for manufacturing the flash memory as the first related art (part 4)

Referring to FIG. 4A, the word line 18 is oxidized to form a first layer 34 as a silicon oxide film. The silicon nitride film is coated with the entire surface of the layer through the CVD method, and etching is performed to the entire surface to form a second layer 36 as a silicon nitride film on the side surface of the first layer 34. The second layer 36 fills the gap between the word lines 18, and serves as the side wall of the word line 18 which is located at the outermost end. The first layer 34 is intended to prevent deterioration in the transistor property under the stress caused by the second layer 36 as the silicon nitride film if it were directly formed on the side of the word line 18. In other words, the first layer 34 serves to alleviate the stress.

Figure 4B:
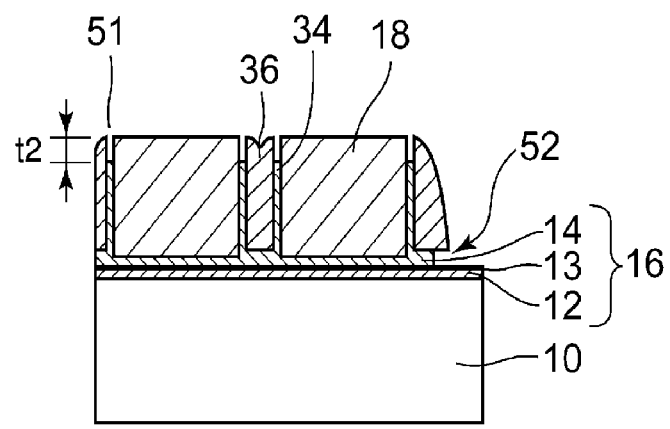
Figure 4C:
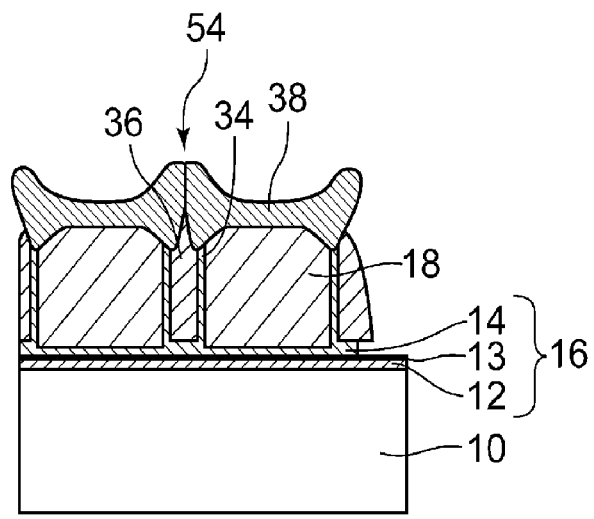

Referring to FIG. 4B, the mask layer 20a as a silicon oxide layer is eliminated using hydrofluoric acid chemical. The intermediate layer 22a and the side wall layers 26a which form the mask layer 20a each formed of the silicon oxide film can be eliminated in a single process step. As the second layer 36 is formed of the silicon nitride film, it is hardly etched in the aforementioned eliminating process. Referring to FIG. 4C, cobalt is formed on the word line 18 so as to be subjected to the thermal processing. The cobalt reacts with the polysilicon at the upper portion of the word line 18 to form a silicide metal layer 38. After that, by the use of a generally employed method for manufacturing a flash memory, the flash memory according to the first comparative example is obtained.

The disadvantage of the first comparative example will be described hereinafter. Referring to FIG. 3B, upon elimination of the top layer 24a as the silicon nitride film, the side wall layers 26a are also etched because of small etching selectivity of the silicon oxide film to the silicon nitride film, that is, 20 or less. The thickness of the top layer 24a formed of the silicon nitride film is required to be approximately 50 nm enough to function as the antireflective film. The side wall layer 26a as the silicon oxide film is etched to the great degree to enlarge a gap t1' between the side wall layers 26a shown in FIG. 3B, which is larger than the gap t1 between the side wall layers 26a shown in FIG. 3A.

Another disadvantage will be described hereinafter. Referring to FIG. 4B, upon elimination of the mask layer 20a, a notch 51 with a depth of t2 is generated in the first layer 34 between the word line 18 and the second layer 36 because the first layer 34 is formed as the silicon oxide film likewise the mask layer 20a. As shown in FIG. 4C, cobalt may be formed in the notch 51 with a relatively large thickness accompanied with the cobalt formation on the word line 18. This may increase the thickness of the silicide metal layer 38 formed on the notch 51. Furthermore, if the interval between the word lines 18 is too short, the thus formed silicide metal layers 38 may contact with each other as an arrow 54 shows. As shown in FIG. 4B, a notch 52 is further generated between the ONO film 16 and the second layer 36, thus causing the second layer 36 to be easily peeled off.

An embodiment of the invention intended to solve the above-described disadvantages will be described as follows.

First Embodiment

Figure 5A:
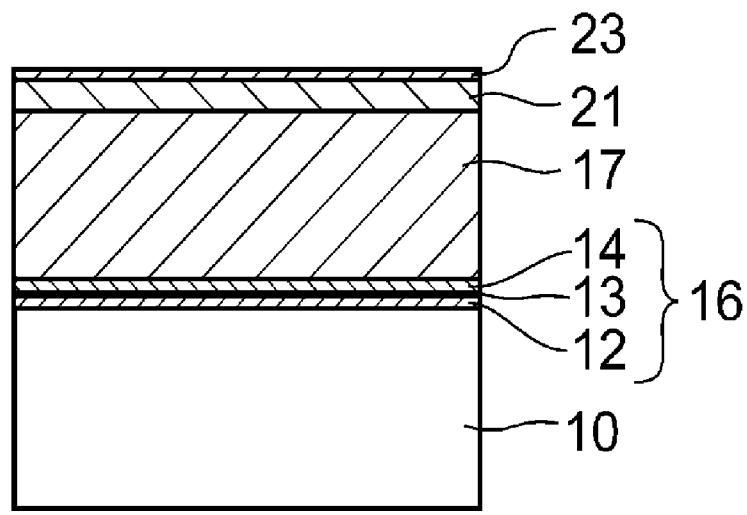
FIGS. 5A and 5B show sectional views illustrating the process for manufacturing a flash memory according to a first embodiment (part 1)

A method for manufacturing a semiconductor device according to a first embodiment will be described referring to FIGS. 5A to 8C. Referring to FIG. 5A, the ONO film 16 and the etching layer 17 are formed on the semiconductor substrate 10 in the same manner as the first comparative example shown in FIG. 1A. An intermediate layer 21 as the silicon oxide film with the thickness of 20 nm is formed on the etching layer 17 through a plasma oxidizing method or the CVD method. A top layer 23 as an amorphous silicon film with the thickness of 10 nm is formed on the intermediate layer 21 through the CVD method.

Figure 5B:
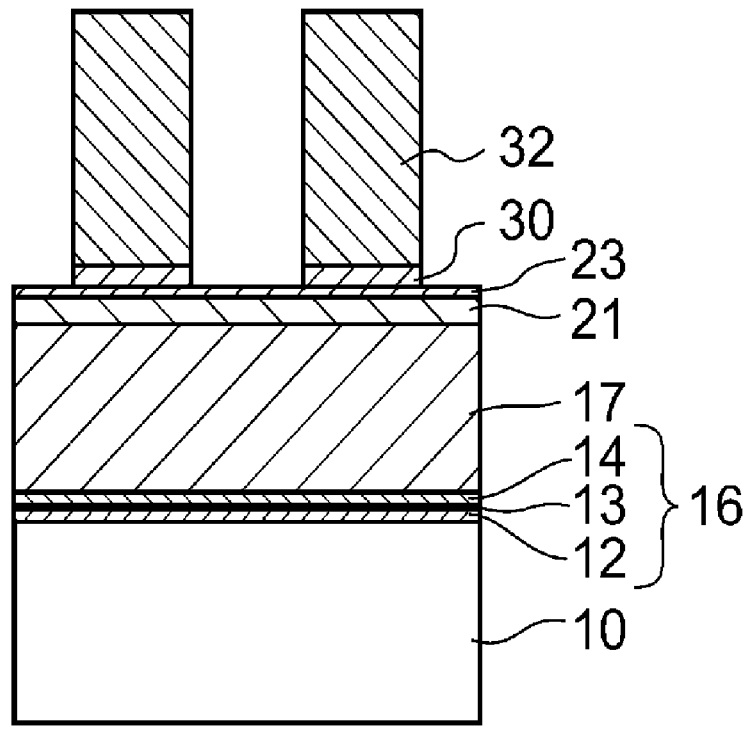

Referring to FIG. 5B, a BARC (Bottom Antireflective Coating) film with the thickness of 40 nm is formed on the top layer 23. The photoresist film 32 is formed on the BARC film 30 to generate a pattern. The pattern size and the pattern interval are the same as those of the first comparative example. The BARC film 30 has a small refractive index (n) and a small absorbing coefficient (k). On the contrary, both n and k of the top layer 23 are large. This makes it possible to form the antireflective film from the top layer 23 and the BARC film 30. The film thickness of the top layer 23 can be reduced to be smaller than that of the top layer 23a of the first comparative example. The top layer 23 formed of amorphous silicon serves to suppress footing formation of the photoresist film 32 without forming the silicon oxide film 27 as in the first comparative example shown in FIG. 1A.

Figure 6A:
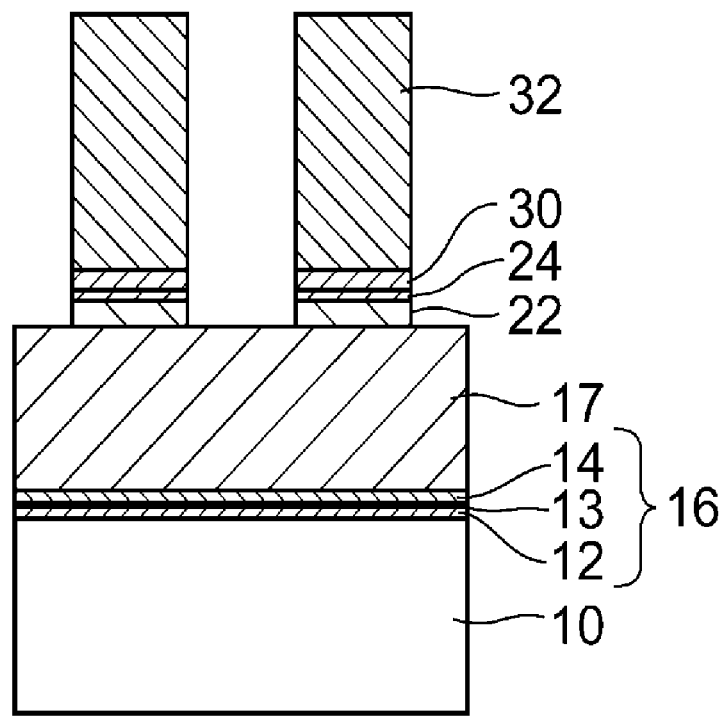
FIGS. 6A and 6B show sectional views illustrating the process for manufacturing the flash memory according to the first embodiment (part 2)
Figure 6B:
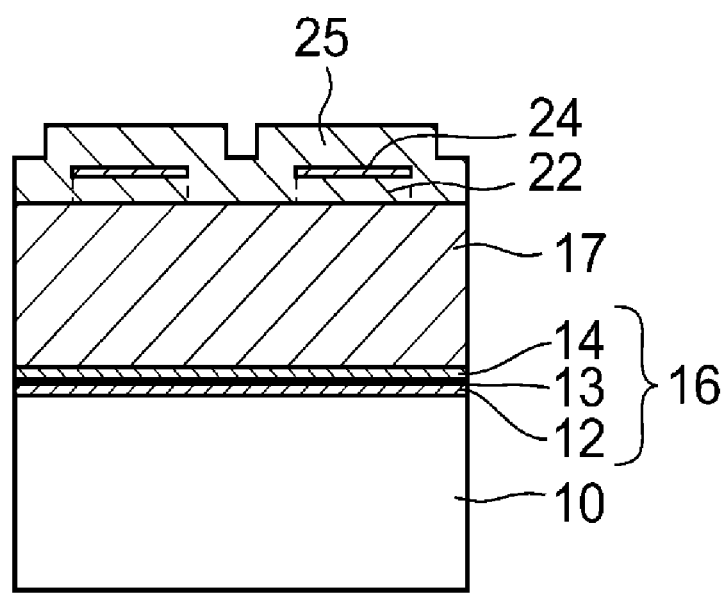

Referring to FIG. 6A, likewise the first comparative example shown in FIG. 2A, the top layer 24 and the intermediate layer 22 are etched while using the photoresist film 32 as a mask. The mixture gas of $HBr$/$Cl_2$/$O_2$ is used for etching the top layer 24, and the mixture gas of $C_4F_8$/$CHF_3$/$Ar$/$O_2$ is used for etching the intermediate layer 22, respectively. Referring to FIG. 6B, likewise the first comparative example shown in FIG. 2B, a cover layer 25 formed of the silicon oxide film with the thickness of 50 nm is formed.

Figure 7A:
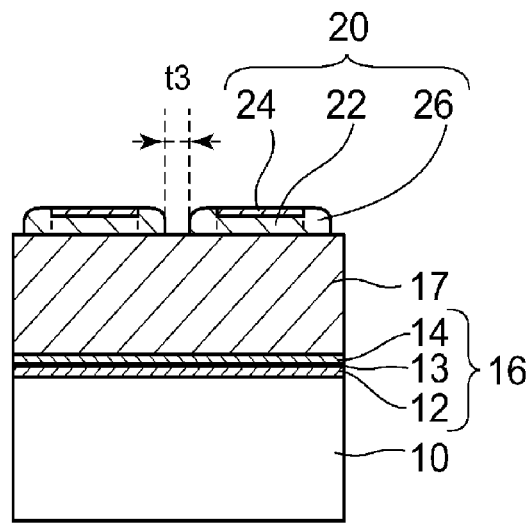
FIGS. 7A to 7C show sectional views illustrating the process for manufacturing the flash memory according to the first embodiment (part 3)
Figure 7B:
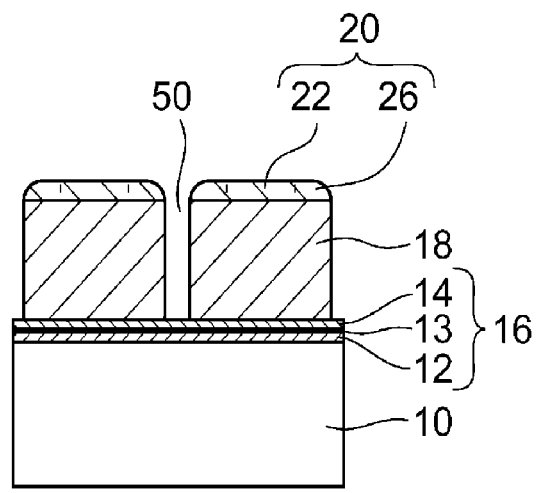
Figure 7C:
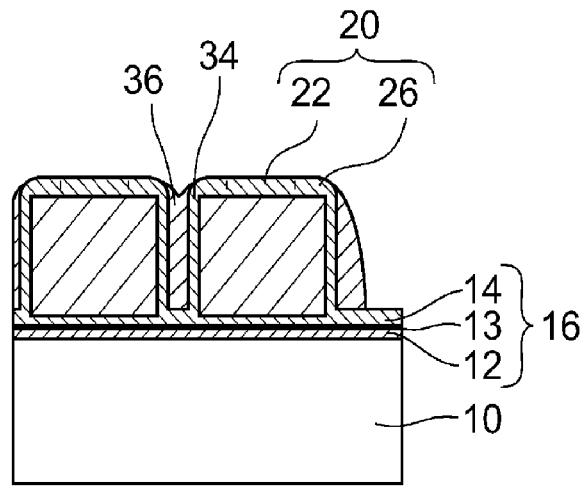

Referring to FIG. 7A, likewise the first comparative example shown in FIG. 3A, the entire surface of the thus formed layer is etched using the mixture gas of $C_4F_8$/$CHF_3$/$Ar$/$O_2$ to form the side wall layers 26 at both sides of the top layer 24 and the intermediate layer 22, and the cover layer 25 on the top layer 24 is completely eliminated. As a result, a mask layer 20 is formed of the intermediate layer 22, the top layer 24, and the side wall layers 26. Referring to FIG. 7B, likewise the first comparative example shown in FIG. 3C, the etching layer 17 is etched while using the mask layer 20 as a mask. The word line 18 is thus formed from the etching layer 17, and the top layer 24 is eliminated. Referring to FIG. 7C, likewise the first comparative example shown in FIG. 4A, the first layer 34 and the second layer 36 are formed.

Figure 8A:
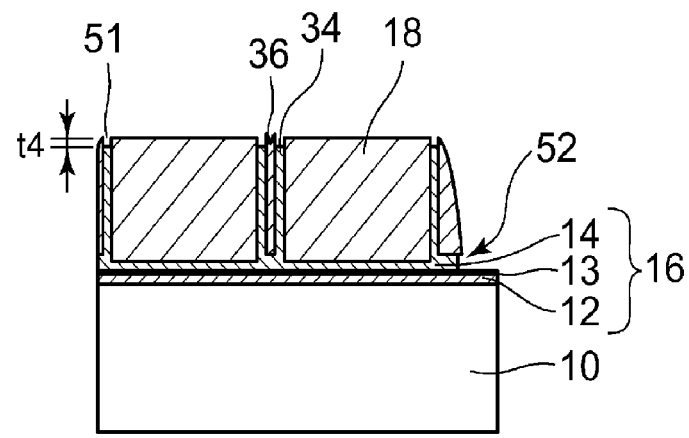
FIGS. 8A to 8C show sectional views illustrating the process for manufacturing the flash memory according to the first embodiment (part 4).
Figure 8B:
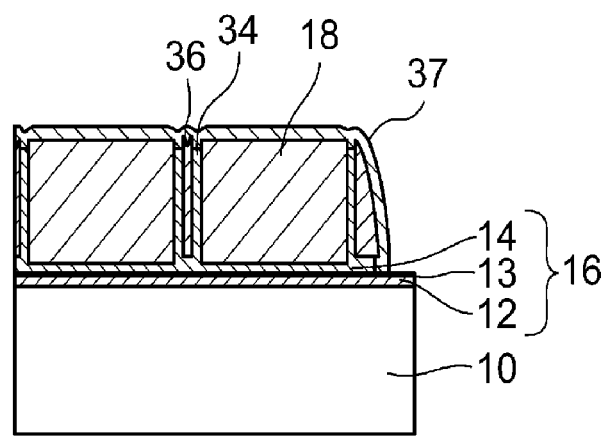

As shown in FIG. 8A, likewise the first comparative example shown in FIG. 4B, the mask layer 20 on the word line 18 is eliminated using the hydrofluoric acid chemical. Referring to FIG. 8B, a metal layer 37 formed of, for example, cobalt is applied onto the word line 18, the first and the second layers 34 and 36, which will be subjected to the thermal processing to form the silicide metal layer 38 on the word line 18. The resultant structure is used to provide a flash memory according to the first embodiment through the generally employed method for manufacturing a flash memory.

In the first embodiment as shown in FIG. 5A, the etching layer 17 is formed, on which the mask layer 20 which has the pattern, and includes the intermediate layer 22 and the top layer 24 formed of the same element as that of the etching layer 17 is formed. The etching layer 17 is etched while using the mask layer 20 as a mask as simultaneously the top layer 24 is eliminated. Likewise the first comparative example shown in FIG. 3B requiring no step of eliminating the top layer 24a, the step of eliminating the top layer 24 does not have to be added, thus reducing the number of the manufacturing process steps.

An arbitrary material other than the one employed in the first embodiment can be used for forming the etching layer 17 and the top layer 24 so long as they are formed of the same element. However, it is preferable to use the silicon (for example, polysilicon, amorphous silicon, single-crystal silicon) for forming the etching layer 17, to use a silicon oxide film for forming the intermediate layer 22, and to use the silicon (for example, polysilicon, amorphous silicon, single-crystal silicon) for forming the top layer 24. If the top layer 24 is formed of the silicon film, the etching selectivity of the intermediate layer 22 to the top layer 24 can be increased. In the case where the mixture gas of $C_4F_8/CHF_3/Ar/O_2$ is used for etching, the etching selectivity of the intermediate layer 22a to the top layer 24a in the first comparative example becomes 20. Meanwhile, in the embodiment, the etching selectivity of the intermediate layer 22 to the top layer 24 in the same condition becomes 100 or greater. The etching selectivity between the silicon oxide film and the silicon can be made larger than the etching selectivity between the silicon oxide film and the silicon nitride film. Accordingly, the mask layer 20 is not etched even if the film thickness of the top layer 24 is reduced as shown in FIG. 7A. Thus, the film thickness of the top layer 24 can be reduced. The use of the top layer 24 and the intermediate layer 22 with a relatively larger etching selectivity suppresses the reduction in the film thickness of the top layer 24 during the etching. This makes it possible to make the intermediate layer 22 thin.

Unlike the first comparative example shown in FIG. 3B having the step of eliminating the top layer 24a as the silicon nitride film, the embodiment has no step of eliminating the top layer 24. As shown in FIG. 7B, this makes it possible to etch the etching layer 17 while keeping the gap t3 between the mask layers 20 shown in FIG. 7A. The interval between the word lines 18 can also be reduced compared with the first comparative example. Unlike the first comparative example shown in FIG. 1A, the use of the top layer 24 as the amorphous silicon film requires no silicon oxide film 27 for suppressing the footing, thus reducing the number of the manufacturing process steps.

In the first embodiment, the amorphous silicon used for forming the top layer 23 grows at approximately 500° C. Meanwhile, in the first comparative example, the silicon nitride film for forming the top layer 23a grows at the temperature in the range from 700° C. to 800° C. The first embodiment allows the low-temperature process compared with the first comparative example. Furthermore, as the film thickness of the intermediate layer 22 can be reduced, it may be formed by subjecting the etching layer 17 to a plasma oxidation. Meanwhile, in the first comparative example, as the intermediate layer 21a has a larger film thickness, it cannot be formed through the plasma oxidation of the etching layer 17. The intermediate layer 21a is required to be formed through the CVD method. In the first embodiment, the use of the plasma oxidation allows the low temperature processing at approximately 500° C.

Referring to FIG. 8A, the first layer 34 and the second layer 36 each formed of the same material as that for forming the intermediate layer 22 are generated between the etching layers 17 (word lines 18) which have been etched. As shown in FIG. 8A, the intermediate layer 22 on the word line 18 (etching layer) is eliminated. In the comparative example 1, the first layer 34 is formed of the same material as that for forming the intermediate layer 22, and the notches 51 and 52 are generated as shown in FIG. 4B. In the first embodiment, the first layer 34 is formed of the same material as the one used for forming the intermediate layer 22. As the film thickness of the intermediate layer 22 is small enough to reduce the time period for etching the intermediate layer 22 on the word line 18 (etching layer), compared with the first comparative example as shown in FIG. 4B. This makes it possible to reduce the notches 51 and 52.

Besides the silicon oxide film, an arbitrary material may be used for forming the first layer 34 so long as it is the same as the material used for forming the intermediate layer 22. In the case where the first layer 34 and the intermediate layer 22 are formed of the silicon oxide films, and the second layer 36 is formed of the silicon nitride film, the intermediate layer 22 can be selectively eliminated using the hydrofluoric acid chemical. In this case, however, relatively large notches 51 and 52 are likely to be generated as shown in FIG. 4B. It is effective to use the polysilicon film for forming the top layer 24 to reduce the film thickness of the intermediate layer 22 to be smaller compared with the first comparative example.

In the case where the silicide metal layer 38 is formed on the word line 18 (etching layer) in the first comparative example as shown in FIG. 4C, the silicide metal layer 38 may cause short circuit as indicated by the arrow 54. Meanwhile, in the first embodiment, as the notches 51 and 52 can be reduced as shown in FIG. 8A, the short circuit in the silicide metal layer 38 may be suppressed, thus reducing the interval between the word lines 18.

Figure 8C:
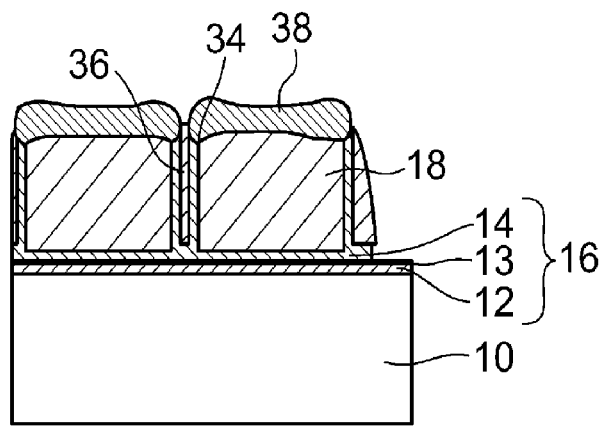

In the step of forming the silicide metal layer 38, the metal layer 37 is formed on the word line 18 (etching layer) as shown in FIG. 8B. As shown in FIG. 8C, the silicide metal layer 38 may be formed from the metal layer 37 and the upper portion of the word line 18 through the thermal processing. If the depth of the notch 51 is large in the course of forming the silicide metal layer 38, the thickness of the metal layer 37 formed in the notch 51 becomes large in the first comparative example shown in FIGS. 4B and 4C. It is, therefore, effective to form the notch 51 to have a small depth as in the first embodiment.

In the first embodiment, the intermediate layer 21 and the top layer 23 are layered on the etching layer 17 as shown in FIG. 5A, the intermediate layer 22 and the top layer 24 are patterned as shown in FIG. 6A, the cover layer 25 as the silicon oxide film is formed on the patterned intermediate layer 22 and the top layer 24 as shown in FIG. 6B, and the entire surface of the cover layer 25 is etched to expose the top layer 24 as shown in FIG. 7A. In this case, the side wall layer 26 is not necessarily required. However, it is preferable to form the side wall layers 26 on the side surfaces of the patterned intermediate layer 22 and the top layer 24 so as to reduce the width of the word line 18.

Upon patterning of the intermediate layer 22 and the top layer 24, the BARC film 30 (antireflective film) and the photoresist film 32 are formed on the top layer 24 as shown in FIG. 5B. Referring to FIG. 6A, the intermediate layer 22 and the top layer 24 are etched while using the photoresist film 32 as a mask. As the top layer 24 and the BARC film 30 formed thereon exhibit the antireflective function upon patterning of the photoresist film 32 even if the film thickness of the top layer 24 is reduced, the film thickness of the top layer 24 can be reduced.

The etching layer 17 may be formed into the word line 18 (gate layer). As the gate layer is generally formed of polysilicon, which is required to be refined, it is especially effective to apply the gate layer to the invention. The polysilicon may include the amorphous silicon in the first comparative example and the first embodiment.

Thus, according to an aspect of the present invention, there is provided a method for manufacturing a semiconductor device including the steps of: forming an etching layer formed of silicon on a semiconductor substrate; forming a mask layer with a pattern on the etching layer, the mask layer including an intermediate layer formed of a silicon oxide film and a top layer formed of silicon; and etching the etching layer using the mask layer as a mask, and eliminating the top layer. The above-described method requires no step of etching the top layer because it is eliminated during the etching process applied to the etching layer. This makes it possible to reduce the manufacturing process step.

The above-described method may further include the steps of forming a first layer formed of a silicon oxide film and a second layer formed of a silicon nitride film sequentially between the etching layers which have been etched, and eliminating the intermediate layer on the etching layer. The method is capable of reducing a notch formed in the first layer when eliminating the intermediate layer on the etching layer.

The above-described method may further include the step of forming a silicide metal layer on an upper portion of the etching layer. The method reduces the interval between the etching layers by decreasing the film thickness of the silicide metal layer formed on the first layer during its formation.

In the above-described method, the step of forming the silicide metal layer may include a step of forming a metal layer on the etching layer, and a step of forming the silicide metal layer from the metal layer and the upper portion of the etching layer through a thermal processing. The method is capable of decreasing the film thickness of the silicide metal layer formed on the first layer even in the state where the film thickness of the silicide metal is likely to increase during its formation.

In the above-described method, the step of forming the mask layer may include the steps of layering the intermediate layer and the top layer on the etching layer, patterning the intermediate layer and the top layer, forming a cover layer formed of a silicon oxide film on the patterned intermediate layer and the top layer, and forming side wall layers on side surfaces of the patterned intermediate layer and the patterned top layer by etching an entire surface of the cover layer to expose the top layer. In the method, the use of the side wall layer may reduce the interval between the etching layers.

In the above-described method, the step of patterning the intermediate layer and the top layer may include the steps of forming an antireflective film and a photoresist film on the top layer, patterning the antireflective film and the photoresist film, and etching the intermediate layer and the top layer using the photoresist film as the mask. The method is capable of decreasing the film thickness of the top layer.

According to another aspect of the present invention, there is provided a method for manufacturing a semiconductor device including the steps of: forming an etching layer; forming a mask layer with a pattern on the etching layer, the mask layer including an intermediate layer and a top layer formed of the same element as that used for forming the etching layer; and etching the etching layer using the mask layer as a mask, and eliminating the top layer. In the method, the top layer is eliminated during the etching of the etching layer, thus eliminating an additional step of etching the top layer. This makes it possible to reduce the manufacturing process step.

The above-described method may further include the steps of forming a first layer and a second layer each formed of the same material as that used for forming the intermediate layer between the etching layers which have been etched, and eliminating the intermediate layer on the etching layer. The method is capable of reducing a notch formed in the first layer during the step of eliminating the intermediate layer on the etching layer.

In the above-described method, the etching layer may be a gate layer.

In the manufacturing method according to the invention, the top layer is eliminated during the etching of the etching layer, thus requiring no additional step of etching the top layer. Thus, the number of the manufacturing process steps can be reduced.

Although the preferred embodiment of the invention has been described, it is to be understood that the invention is not limited to the aforementioned specific embodiment. The invention may be changed and modified to arbitrary forms without departing from the scope of the invention.

We claim:

1. A method for manufacturing a semiconductor device comprising the steps of:
    forming an etching layer formed of silicon on a semiconductor substrate;
    forming a mask layer with a pattern on the etching layer, the mask layer including an intermediate layer formed of a silicon oxide film and a top layer formed of silicon, wherein the step of forming the mask layer includes the steps of:
        layering the intermediate layer and the top layer on the etching layer;
        patterning the intermediate layer and the top layer;
        forming a cover layer formed of a silicon oxide film on the patterned intermediate layer and the top layer; and
        forming side wall layers on side surfaces of the patterned intermediate layer and the patterned top layer by etching an entire surface of the cover layer to expose the top layer; and
    etching the etching layer using the mask layer as a mask, and eliminating the top layer, the etching layer etched to form a plurality of word lines.

2. The method for manufacturing a semiconductor device according to claim 1, further comprising the steps of:
    forming a first layer formed of a silicon oxide film and a second layer formed of a silicon nitride film sequentially between each of the plurality of word lines which have been etched; and
    eliminating the intermediate layer on the etching layer.

3. The method for manufacturing a semiconductor device according to claim 2, further comprising the step of forming a silicide metal layer on an upper portion of the plurality of word lines.

4. The method for manufacturing a semiconductor device according to claim 3, wherein the step of forming the silicide metal layer includes the step of forming a metal layer on the plurality of word lines, and the step of forming the silicide metal layer from the metal layer and the upper portion of the plurality of word lines through a thermal processing.

5. The method for manufacturing a semiconductor device according to claim 1, wherein the step of patterning the intermediate layer and the top layer includes the steps of:
   forming an antireflective film and a photoresist film on the top layer;
   patterning the antireflective film and the photoresist film; and
   etching the intermediate layer and the top layer using the photoresist film as the mask.

6. A method for manufacturing a semiconductor device comprising the steps of:
   forming an etching layer;
   forming a mask layer with a pattern on the etching layer, the mask layer including an intermediate layer and a top layer formed of the same element as that used for forming the etching layer, wherein the step of forming the mask layer includes the steps of:
      layering the intermediate layer and the top layer on the etching layer;
      patterning the intermediate layer and the top layer;
      forming a cover layer formed of a silicon oxide film on the patterned intermediate layer and the top layer; and
      forming side wall layers on side surfaces of the patterned intermediate layer and the patterned top layer by etching an entire surface of the cover layer to expose the top layer; and
   etching the etching layer using the mask layer as a mask, and eliminating the top layer, the etching layer etched to form a plurality of word lines.

7. The method for manufacturing a semiconductor device according to claim 6, further comprising the steps of:
   forming a first layer and a second layer each formed of the same material as that used for forming the intermediate layer between each of the plurality of word lines which have been etched; and
   eliminating the intermediate layer on the etching layer.

8. The method for manufacturing a semiconductor device according to claim 1, wherein the etching layer is a gate layer.

9. The method for manufacturing a semiconductor device according to claim 6, wherein the etching layer is a gate layer.

10. The method for manufacturing a semiconductor device according to claim 6, wherein the step of patterning the intermediate layer and the top layer includes the steps of:
    forming an antireflective film and a photoresist film on the top layer;
    patterning the antireflective film and the photoresist film; and
    etching the intermediate layer and the top layer using the photoresist film as the mask.

11. The method for manufacturing a semiconductor device according to claim 1, wherein the step of forming the cover layer does not form side wall layers.

12. The method for manufacturing a semiconductor device according to claim 6, wherein the step of forming the cover layer does not form side wall layers.

* * * * *